United States Patent
Fox et al.

(10) Patent No.: US 10,651,649 B1
(45) Date of Patent: May 12, 2020

(54) DISCRETE VOLTAGE/ OPEN INPUT

(71) Applicant: Hamilton Sundstrand Corporation, Charlotte, NC (US)

(72) Inventors: Brennan Fox, Geneseo, IL (US); Lon R. Hoegberg, Belvidere, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/220,769

(22) Filed: Dec. 14, 2018

(51) Int. Cl.
*H02J 1/10* (2006.01)
*H02K 3/22* (2006.01)
*H02K 9/04* (2006.01)
*G05F 3/18* (2006.01)
*H02J 1/08* (2006.01)

(52) U.S. Cl.
CPC .............. *H02J 1/108* (2013.01); *H02J 1/102* (2013.01); *H02K 3/22* (2013.01); *H02K 9/04* (2013.01); *G05F 3/18* (2013.01); *H02J 1/082* (2020.01)

(58) Field of Classification Search
CPC .......... H02K 9/04; H02K 3/22; H03K 19/003; H03K 19/00315; H03K 19/017509; G05F 3/18; H02J 2001/008; H02J 1/102; H02J 1/108
See application file for complete search history.

(56) References Cited

U.S. PATENT DOCUMENTS

| 4,667,282 A | 5/1987 | Peterson | |
|---|---|---|---|
| 9,077,256 B2 | 7/2015 | Basso et al. | |
| 9,155,232 B2 | 10/2015 | Gasperi | |
| 2007/0279106 A1* | 12/2007 | Bennett | H03K 17/0822 327/110 |
| 2012/0139589 A1* | 6/2012 | Machida | H02M 3/33507 327/109 |
| 2012/0287540 A1* | 11/2012 | Dobkin | H02H 1/06 361/56 |

* cited by examiner

*Primary Examiner* — Fred E Finch, III
*Assistant Examiner* — Rafael O. De León Domenech
(74) *Attorney, Agent, or Firm* — Locke Lord LLP; Scott D. Wofsy; Joshua L. Jones

(57) ABSTRACT

An input circuit includes an input line for providing input regarding state of a supply at a first node. An impedance is connected to the input line at a second node for connecting the input line to ground. A Zener diode can be connected in the input line in series between the first and second nodes to impede current flowing through the Zener diode below the Zener voltage thereof in a direction from the first node to the second node, and to allow current above the Zener voltage thereof in the direction from the first node to the second node, wherein the input line is free of any node connecting a power voltage source to the input line between the first and second nodes.

13 Claims, 1 Drawing Sheet

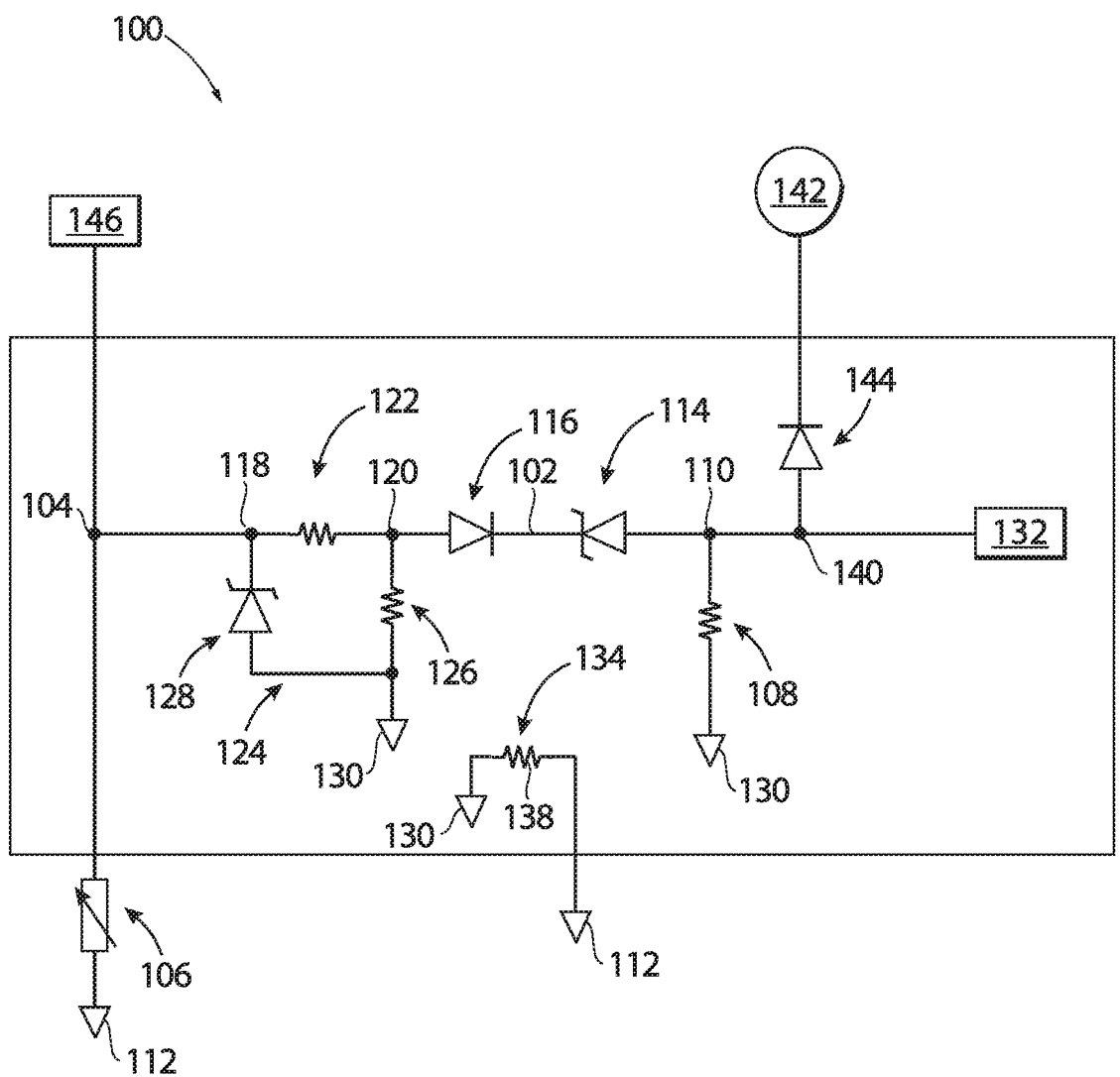

DISCRETE VOLTAGE/ OPEN INPUT

BACKGROUND OF THE INVENTION

1. Field of the Invention

The present disclosure relates to circuits to sense the state of a discrete input, and more particularly to voltage/open inputs.

2. Description of Related Art

Conventional topologies for voltage open input sense circuits provide a logic high input to a logic component if a voltage is applied to the input and a logic low if the voltage is disconnected. There is also a minimum current required at a logic high. The conventional topologies are restricted in operating range when the circuit has a power supply voltage that varies over a wide range. This problem is exacerbated by the voltage thresholds needed by individual logic devices to register a logic high and a logic low. Lightning transients, or the like, also force large resistances to be used in order to protect the circuit from damage. So, a conventional circuit must output a logic low even when the voltage supply is at its maximum for a given input voltage. And a conventional circuit must also output a logic high when the voltage supply is at a minimum with a minimum load resistance. Lightning transients also force large resistances to be used in order to protect the circuit from damage.

The conventional techniques have been considered satisfactory for their intended purpose. However, there is an ever present need for improved input circuits. This disclosure provides a solution for this problem.

SUMMARY OF THE INVENTION

An input circuit includes an input line for providing input regarding state of a supply at a first node. A main grounding impedance is connected to the input line at a second node for connecting the input line to ground. A Zener diode can be connected in the input line in series between the first and second nodes to impede current flowing through the Zener diode below the Zener voltage thereof in a direction from the first node to the second node, and to allow current above the Zener voltage thereof in the direction from the first node to the second node, wherein the input line is free of any node connecting a power voltage source to the input line between the first and second nodes.

A second diode is connected in the input line in series with the Zener diode between the first and second nodes. The second diode is oriented to impede current flowing in the direction from the second node to the first node for lightning/transient protection. The second diode is between the first node and the Zener diode. The second diode is a non-Zener diode.

A third node is included in the input line between the Zener diode and the first node. A fourth node is included in the input line between the Zener diode and the third node with a first impedance connected in series between the third node and the fourth node. A clamp line is connected to the third node and to the fourth node in parallel to the input line. A second impedance is connected in series in the clamp line between the third node and the fourth node. A clamp diode is connected in series in the clamp line between the second impedance and the third node. The clamp diode is oriented to ensure current through the clamp line does not flow in a direction from the third node to the fourth node for protecting the input line from transients from a supply connected to the first node. The clamp line includes a ground connection in series between the second impedance and the clamp diode.

A logic device is operatively connected to the second node of the input line for receiving voltage input as a logic high from the input line and for receiving open input as a logic low from the input line. The logic device has a logic high voltage that is related to the Zener voltage of the Zener diode.

The main grounding impedance is connected in series between the second node and an internal ground connection. An internal-external ground connection connects between the internal ground connection and an external ground through a second grounding impedance.

A method of providing input from a supply to a logic device includes impeding current through an input line to a logic device with a Zener diode to ensure a logic low is input to the logic device when voltage across the Zener diode is below the Zener voltage of the Zener diode.

The method includes allowing current through the input line to ensure a logic high is input to the logic device when voltage across the Zener diode exceeds the Zener voltage of the Zener diode, without connecting a power voltage source to the input line between the Zener diode and a first node of the input line where the current is input into the input line.

The method includes protecting the input line from transients with a diode in the input line oriented to oppose current in a direction from the logic device into the input line. Impeding the current and allowing current include providing voltage/open input to the logic device for determining whether a supply is powered or not. Impeding the current and allowing current include providing voltage/open input to the logic device to determine whether a voltage source is powered on or not.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain FIGURES, wherein:

FIG. 1 is a schematic view of an exemplary embodiment of an input circuit constructed in accordance with the present disclosure, showing the configuration for a voltage/open topology.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an exemplary embodiment of an input circuit in accordance with the disclosure is shown in FIG. 1 and is designated generally by reference character 100. The systems and methods described herein can be used to provide voltage open input to logic devices.

The input circuit 100 includes an input line 102 for providing input regarding the state (voltage or open) of a supply 106 at a first node 104 on the input line 102. Voltage for powering the supply 106 can be connected at the first node 104. A main grounding impedance, i.e., resistor 108, is connected to the input line 102 at a second node 110 for connecting the input line 102 to ground 112. A Zener diode 114 is connected in the input line 102 in series between the first node 104 and the second node 110. The Zener diode 114 impedes current flowing through the Zener diode 114 below the Zener voltage thereof in a direction from the first node 104 to the second node 110, and allows current above the Zener voltage thereof in the direction from the first node 104 to the second node 110. The input line 102 is free of any node connecting a power voltage source to the input line 102 between the first and second nodes 104, 110.

A second diode 116 is connected in the input line 102 in series with the Zener diode 114 between the first and second nodes 104, 110. The second diode 116 is oriented to impede current flowing in the direction from the second node 110 to the first node 104 for negative lightning/transient protection. The second diode 116 is between the first node 104 and the Zener diode 114. The second diode 116 is a non-Zener diode. The inclusion of the second diode 116 allows lower impedances to be used, e.g., on the resistor 108.

A third node 118 is included in the input line 102 between the Zener diode 114 and the first node 104. A fourth node 120 is included in the input line 102 between the Zener diode 114 and the third node 118 with a first impedance, resister 122, connected in series between the third node 120 and the fourth node 120. A clamp line 124 is connected to the third node 118 and to the fourth node 120 in parallel to the input line 102. A second impedance, resistor 126, is connected in series in the clamp line 124 between the third node 118 and the fourth node 120. A clamp diode 128, e.g., a Zener diode, is connected in series in the clamp line 124 between the second impedance, resistor 126, and the third node 118. The clamp diode 128 is oriented to ensure current through the clamp line 124 does not flow in a direction from the third node 118 to the fourth node 120 for protecting the input line 102 from transients from a supply connected to the first node 104. The clamp line 124 includes a local ground connection 130 in series between the second impedance (resister 126) and the clamp diode 128. The clamp diode 128 provides a clamp to the second impedance, which can be a parallel RC (resistor capacitor) combination rather than a resistor 126. If a high voltage transient cannot be filtered then the clamp diode 128 can be used to clamp the input voltage and protect the input circuit 100. Those skilled in the art will readily appreciate that resistors 122 and 126 need not be resistors per se, but can be any suitable impedance without departing from the scope of this disclosure.

A logic device 132 is operatively connected to the second node 110 of the input line 102 for receiving voltage input as a logic high from the input line 102 and for receiving open input as a logic low from the input line 102. The logic device 132 has a logic high voltage that is related to the Zener voltage of the Zener diode 114, e.g., the Zener voltage can be the same as, but does not necessarily need to be the same as, the logic high voltage. This allows control over where the transition between logic high and logic low takes place for the logic device 132. A fifth node 140 in the input line 102 connects a logic voltage 142 through a diode 144 to the fifth node 140 to protect the logic device 132. Diode 144 provides a diode clamp to the supply (logic voltage 142) of logic device 132 to protect the logic device 132 from overvoltage on the input of the logic device 132. The diode 144 is oriented to impede current flowing from the logic voltage 142 to the input line 102.

The main grounding impedance (resistor 108) is connected in series between the second node 110 and an internal ground connection 130. An internal-external ground connection 134 connects between the internal ground connections 130 of the claim line 124 and of resistor 108 and the external ground 112 through a second grounding impedance 138.

A method of providing input from a supply, e.g. supply 106, to a logic device, e.g., logic device 132, includes impeding current through an input line, e.g., input line 102, to a logic device with a Zener diode, e.g., Zener diode 114, to ensure a logic low is input to the logic device when voltage across the Zener diode is below the Zener voltage of the Zener diode. The method includes allowing current through the input line to ensure a logic high is input to the logic device when voltage across the Zener diode exceeds the Zener voltage of the Zener diode, without connecting a power voltage source to the input line between the Zener diode and a first node, e.g. first node 104, of the input line where the current is input into the input line.

The method includes protecting the input line from transients with a diode, e.g., diode 116, in the input line oriented to oppose current in a direction from the logic device into the input line. Impeding the current and allowing current include providing voltage open input to the logic device for determining whether a supply is grounded or not. Impeding the current and allowing current include providing voltage open input to the logic device to determine whether a voltage source, e.g. a voltage source 146 connected to the first node 104 to power the supply 106, is powered on or not.

Systems and methods as disclosed herein provide potential benefits over conventional techniques, including lower power dissipation in the voltage and open states. They can also provide for cleaner logic transitions. Systems and methods as disclosed herein can be made more suitable than conventional topologies for conversion to stand-alone integrated circuits, including physical area reduction.

The methods and systems of the present disclosure, as described above and shown in the drawings, provide for voltage open inputs with superior properties including the potential benefits described above. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An input circuit comprising:
   an input line for providing input regarding state of a supply at a first node;
   a main grounding impedance connected to the input line at a second node for connecting the input line to ground, and wherein the input line is free of any node connecting a power voltage source to the input line between the first and second nodes;
   a Zener diode connected in the input line in series between the first and second nodes to impede current flowing through the Zener diode below the Zener voltage thereof in a direction from the first node to the second node, and to allow current above the Zener voltage thereof in the direction from the first node to the second node;
   a third node in the input line between the Zener diode and the first node; a fourth node in the input line between the Zener diode and the third node; a first impedance connected in series between the third node and the fourth node; a clamp line connected to the third node and to the fourth node in parallel to the input line; a resistor connected in series in the clamp line between the third node and the fourth node; and a clamp diode connected in series in the clamp line between the resistor and the third node, wherein the clamp diode is oriented to ensure current through the clamp line does not flow in a direction from the third node to the fourth node for protecting the input line from transients from a supply connected to the first node.

2. The circuit as recited in claim 1, further comprising a second diode connected in the input line in series with the Zener diode between the first and second nodes, wherein the second diode is oriented to impede current flowing in the direction from the second node to the first node for lightning/transient protection.

3. The circuit as recited in claim 2, wherein the second diode is between the first node and the Zener diode.

4. The circuit as recited in claim 2, wherein the second diode is a non-Zener diode.

5. The circuit as recited in claim 1, wherein the clamp line includes a ground connection in series between the second impedance and the clamp diode.

6. The circuit as recited in claim 1, further comprising a logic device operatively connected to the second node of the input line for receiving voltage input as a logic high from the input line and for receiving open input as a logic low from the input line.

7. The circuit as recited in claim 6, wherein the logic device has a logic high voltage that is related to the Zener voltage of the Zener diode.

8. The circuit as recited in claim 1, wherein the main grounding impedance is connected in series between the second node and an internal ground connection.

9. The circuit as recited in claim 8, further comprising an internal-external ground connection connecting between the internal ground connection and an external ground through a second grounding impedance.

10. A method of providing input from a supply to a logic device comprising:

impeding current through an input line to a logic device with a Zener diode to ensure a logic low is input to the logic device when voltage across the Zener diode is below the Zener voltage of the Zener diode; and allowing current through the input line to ensure a logic high is input to the logic device when voltage across the Zener diode exceeds the Zener voltage of the Zener diode, without connecting a power voltage source to the input line between the Zener diode and a first node of the input line where the current is input into the input line.

11. The method as recited in claim 10, further comprising protecting the input line from transients with a diode in the input line oriented to oppose current in a direction from the logic device into the input line.

12. The method as recited in claim 10, wherein impeding the current and allowing current include providing voltage/open input to the logic device for determining whether a supply is powered or not.

13. The method as recited in claim 10, wherein impeding the current and allowing current include providing voltage/open input to the logic device to determine whether a voltage source is powered on or not.

* * * * *